United States Patent [19]

Tepman et al.

[11] Patent Number: 5,730,801
[45] Date of Patent: Mar. 24, 1998

[54] COMPARTNETALIZED SUBSTRATE PROCESSING CHAMBER

[75] Inventors: Avi Tepman; Gerald Zheyao Yin, both of Cupertino; Donald Olgado, Mountain View, all of Calif.

[73] Assignee: Applied Materials, Inc., Santa Clara, Calif.

[21] Appl. No.: 296,043

[22] Filed: Aug. 23, 1994

[51] Int. Cl.$^6$ ............................................... C23C 16/00
[52] U.S. Cl. ............. 118/719; 118/715; 118/723 E; 118/729; 118/733; 204/298.25; 156/345; 414/935; 414/939
[58] Field of Search ............... 118/715, 719, 118/723 E, 729, 733; 204/298.25; 156/345; 414/935, 939; 277/56

[56] References Cited

U.S. PATENT DOCUMENTS

| | | | |
|---|---|---|---|
| 2,766,022 | 10/1956 | Bender | 277/56 |
| 4,094,722 | 6/1978 | Yamamoto | 156/345 |
| 4,100,055 | 7/1978 | Rainey | 204/298 |
| 4,148,705 | 4/1979 | Battey | 204/192 E |
| 4,149,923 | 4/1979 | Vehara | 156/345 |
| 4,151,034 | 4/1979 | Yamamoto | 156/345 |
| 4,158,589 | 6/1979 | Keller | 156/345 |
| 4,160,690 | 7/1979 | Shibagaki | 156/643 |
| 4,209,357 | 6/1980 | Gorin | 156/643 |
| 4,231,695 | 11/1980 | Weston | 277/56 |
| 4,534,314 | 8/1985 | Achley | 118/733 |
| 4,539,062 | 9/1985 | Zajac | 156/345 |
| 4,547,247 | 10/1985 | Warenback | 156/345 |
| 4,585,920 | 4/1986 | Hoog et al. | 219/121 PR |
| 4,793,975 | 12/1988 | Drage | 422/186.05 |
| 4,795,299 | 1/1989 | Boys et al. | 414/217 |
| 4,816,638 | 3/1989 | Ukai et al. | 219/121.43 |
| 4,861,563 | 8/1989 | Shekerjian et al. | 422/186 |
| 4,969,790 | 11/1990 | Petz et al. | 414/217 |
| 5,024,747 | 6/1991 | Turner | 204/298.09 |
| 5,058,526 | 10/1991 | Matsushita | 118/715 |
| 5,076,205 | 12/1991 | Vowles et al. | 118/719 |
| 5,092,728 | 3/1992 | Crabb et al. | 414/217 |
| 5,154,730 | 10/1992 | Hodos et al. | 29/25.01 |
| 5,232,508 | 8/1993 | Arena | 118/719 |
| 5,245,736 | 9/1993 | Schertler et al. | 29/33 |
| 5,314,574 | 5/1994 | Takahashi | 156/646 |
| 5,388,944 | 2/1995 | Takanabe | 414/217 |
| 5,460,684 | 10/1995 | Saeki | 156/345 |
| 5,516,367 | 5/1996 | Lei | 118/725 |

FOREIGN PATENT DOCUMENTS

| | | |
|---|---|---|
| 0342688 | 11/1987 | European Pat. Off. . |
| 55-141570 | 11/1980 | Japan . |
| 426760 | 1/1992 | Japan ................ 204/298.07 |

OTHER PUBLICATIONS

Temescal/Plasma–Sette II, date unknown, believed to be May 1983.
Airco Temescal, Technical Service Bulletin, No. 83–1, Mar. 4, 1983.
Salzer Technology Enterprises, Inc., Plasma Industry Service, report 83–2, Dec. 1983.
Itakura Hideaki; Komiya, Hiroyoshi; Ukai, Katsumi; Multi–Chamber Dry Etching System; Apr. 1982.
IBM, Technical Disclosure Bulletin, vol. 20, No. 8, Jan. 1978.

*Primary Examiner*—R. Bruce Breneman
*Assistant Examiner*—Jeffrie R. Lund
*Attorney, Agent, or Firm*—Janis Biksa; Donald Verplancken; Peter Sgarbossa

[57] ABSTRACT

A process chamber for semiconductor wafers is formed of multiple compartments. A first compartment is provided for supplying an isolated environment for processing the wafers, and a second compartment is provided, in selective communication with the first compartment, to load and unload wafers from the chamber. The wafer handling equipment is located in the second compartment to isolate it from the process environment, and thus form a clean, non-contaminating, environment for the wafer handling equipment. When the chamber must be cleaned, only the first compartment must be cleaned, as no processing occurs in the second chamber. Therefore, the entire first chamber may be removed for cleaning, and replaced with a clean first compartment to decrease chamber turnaround time during chamber cleaning operations.

47 Claims, 8 Drawing Sheets

COMPARTMENTALIZED SUBSTRATE PROCESSING CHAMBER

BACKGROUND OF THE INVENTION

1. Field of the Invention

The present invention relates to the field of semiconductor processing, wherein integrated circuits and other devices are formed on a substrate. More particularly, the present invention relates to processing chambers useful for forming microelectronic devices on semiconductor wafers and other substrates.

2. Background of the Art

Semiconductor processing chambers are used to provide process environments for the fabrication of integrated circuits and other semiconductor devices on wafers. To form the integrated circuits on the wafers, they may be sequentially processed, first in a deposition chamber in which a film layer of a metal, dielectric or insulator material is deposited on the wafer, then in a lithographic process chamber wherein a mask is formed on the deposited film layer, and then in an etch chamber where selected portions of the previously deposited film layer are etched. One or more ion implant and passivation steps may also be used to process the wafer. By repetitively depositing a film layer on the wafer, forming a mask over the film layer, and then selectively etching areas of the film layer exposed by the mask, an integrated circuit device may be fabricated on the wafer.

Most prior art semiconductor etch and deposition chambers have several common features. For example, most such chambers are built around a vacuum enclosure in which the wafer is received for processing. A gas inlet having a mass flow controller, and a throttled exhaust coupled to a vacuum pump through a gate valve, communicate with the chamber enclosure to provide the process gas flow and the vacuum conditions necessary for wafer processing. A wafer support member is located within the enclosure to provide a secure resting place for the wafer in the enclosure during the deposition or etch process. A slit valve extends through the enclosure wall to allow a robot blade to place the wafer on, and remove the wafer from, the support member.

To perform the etch or deposition process step in the chamber, a process gas is flowed through the vacuum enclosure. The gas may, as with chemical vapor deposition, deposit a film on the wafer, or the gas may provide disassociated gas atoms which, when exposed to an electric field in the enclosure, are excited into a plasma. The plasma may form an etch plasma to selectively etch a film layer already deposited on the wafer, or the plasma may be used to sputter a target, as with physical vapor deposition, to provide material to form a deposition film layer on the wafer. After the film layer is deposited on the wafer, or after the deposition layer previously formed on the wafer is etched, the process gas is evacuated from the enclosure and the wafer is removed from the enclosure through the slit valve.

During each of the aforementioned processes, a film layer is also formed on the exposed surfaces of the enclosure, including the surfaces of the enclosure walls, the support member, the slit valve, the enclosure inlet, and even within chamber support equipment including the enclosure exhaust, and the pump. The film layer formed on the chamber surfaces may, as with deposition processes, be primarily comprised of the deposition layer material, or, as with etch processes, may be primarily comprised of by-products of etching. This film layer is friable and, if left in place, could form contaminant particles in the enclosure which could deposit on the wafer. Where a contaminant particle of sufficient size deposits on a wafer, one or more semiconductor devices being formed on the wafer will be defective. Therefore, the enclosure must be periodically cleaned to remove these contaminants.

To clean the interior surfaces of the chamber, the cover, or another access panel, of the vacuum enclosure is removed to expose the interior surfaces of the enclosure. The film layer formed on the interior walls and other surfaces of the enclosure is then cleaned with water and/or other materials. Additionally, the other chamber components that may be exposed to the process environment, such as the vacuum pump and the throttle valve, are also removed from the chamber so that the interior pump and valve surfaces may be cleaned. After cleaning, the pump, valves and cover are replaced, and the enclosure is again pumped down to the operating pressure. Because water is used to clean the enclosure surfaces, and water is adsorbed on the metallic enclosure surfaces during the cleaning process, the water must be removed from the enclosure before a satisfactory, stable, vacuum pressure can be maintained in the chamber. Therefore, the chamber is "baked out", at an elevated temperature, to help drive the water from the enclosure surfaces and thus provide a "dry" enclosure environment in which a stable vacuum may be maintained. This bake out period typically lasts at least 8 hours.

The time required to clean and bake out the process chamber is "down time" for the user of the process chamber, because no wafer processing can occur in the chamber during these periods. The amount of chamber down time is further compounded when the process chamber is coupled to multiple other process chambers through a transfer chamber, and the process chamber slit valve must be cleaned. The slit valve must be open during at least a period of the time it is being cleaned. Because the process chamber cover is removed to provide access to the slit valve, the open slit valve communicates ambient conditions to the transfer chamber when it is cleaned. Additionally, water or other materials may contact the transfer chamber surfaces when the slit valve is open during cleaning of the slit valve or chamber, thereby necessitating bake out of the transfer chamber to achieve a stable vacuum after the process chamber is cleaned and resealed. During the period of time that the slit valve is open to the transfer chamber, communication between the transfer chamber and all of the other process chambers must be interrupted to ensure that the cleaning of the one process chamber does not contaminate any of the other process chambers linked to the transfer chamber. Therefore, each of the other process chambers linked to the transfer chambers cannot be used while the process chamber slit valve is being cleaned, or, only those wafers already placed in the other process chambers at the time the slit valve is opened can be processed, and those wafers cannot be removed from the other process chambers until the slit valve is closed to isolate the transfer chamber and the transfer chamber is pumped down and, if necessary, baked out.

In addition to the down time attributable to the cleaning and baking out of the process chamber, many chamber maintenance procedures contribute to chamber down time. For example, servicing of the pump and the pump throttle valve often contributes to down time. In the typical prior art process chamber, the throttle valve is located intermediate of the chamber enclosure and the pump. If the throttle valve must be serviced, or must be cleaned without the need to clean the pump, the pump must still be removed to provide access to the throttle valve. The time needed to remove the pump and the throttle valve is substantially greater than would be necessary to remove the throttle valve alone, and this time difference contributes to chamber downtime. Additionally, once the pump is removed from the chamber, and the interior surfaces thereof are exposed to the atmosphere, the pump itself must be baked out or otherwise stabilized before the pump can maintain a stable vacuum pressure.

The existence of moving parts within the chamber enclosure, such as the intermediate wafer support used to transfer the wafer from a robot blade to the support member, are also a source of chamber down time. The moveable parts within the chamber enclosure receive a deposition or contaminant layer during the use of the chamber because they are exposed to the process environment within the chamber. This contaminant layer is a primary source of particle contaminants on the wafer because the movement of these parts tends to free portions of the contaminant layer deposited thereon during processing. Therefore, these surfaces must be periodically cleaned which increases the time needed to clean the chamber.

One prior art device known to applicants maintained a process environment in a separate compartment from the substrate loading environment, and thus at least partially isolated the process environment from the substrate loading equipment used to position the substrates on a support member. This multi-station device, known as an Eclipse sputter tool which has been available from MRC, included a large main chamber connected, through a fire wall, to a plurality of separate processing stations. Each processing station was located on the exterior of the firewall over a chamber aperture. A plurality of substrate heaters were located within the main chamber, and each heater was dedicated to a particular processing station. A large rotatable transfer plate, having a plurality of apertures therein, was located substantially parallel to the firewall. A substrate could be supported within each of the apertures in the rotating plate, so that each substrate could be moved within the main chamber to be positioned in alignment with each of the firewall apertures, and thus in alignment with each of the processing stations.

The MRC multi-station tool was used to sequentially process substrates through one or more of the processing stations, wherein a sputter environment is maintained in each of the processing stations. In operation, the substrates were loaded into the apertures in the rotating plate at a load position, and rotated through the entire multi-station tool for processing. To perform the processing steps on the substrates, the substrates are first aligned over the individual processing stations, and the substrate heaters were moved from a retracted position within the main chamber to an extended position. The heaters included a plate portion, which engaged the backside of the substrates within the rotating wall apertures to heat the substrates, and an extending annular wall, which engaged against the rotating plate and pressed the rotating plate against the firewall. Seals were provided at the interface of the annular wall against the rotating plate, and between the rotating plate and the firewall, to create a sealed station for the sputter process. Once all of the heaters were moved into their extended positions, a sputter deposition environment would be created in each of the process stations. After the process was completed in the process stations, each of the heaters were retracted from their respective process chambers and the rotating plate was rotated to position the substrates at the next processing station.

The configuration of the MRC multi-station tool has several inherent limitations. In particular, the tool is inherently prone to cross-contamination between the stations, because a portion of the rotating plate is exposed to each process environment as the substrates are rotated for processing in each of the processing stations. Thus, where different materials are deposited on the substrates in different processing stations, impurities, consisting of materials other than those present in the specific processing stations, can enter the main chamber when released from the rotating plate. Additionally, trace amounts of the process environment maintained in each of the processing stations would be discharged into the main chamber when the heaters are retracted from the individual processing stations. These trace amounts of contaminants commingle and build up in the main chamber and in the process stations, to the point where the entire multi-station tool, including the large main chamber, must be cleaned to prevent contamination of the process environments maintained in the individual processing stations. Finally, the tool is slow in operation, because throughput is limited by the slowest process being performed in the tool.

There exists a need in the art for a processing chamber in which the turnaround time for chamber cleaning is reduced, and an arrangement wherein multiple chambers may be connected to a transfer chamber yet the cleaning of a given chamber does not require other chambers connected to the transfer chamber to be shut down for the cleaning of the process chamber.

SUMMARY OF THE INVENTION

The present invention provides methods and apparatus for processing of wafers in a processing chamber wherein the processing chamber is divided into at least two compartments, and the processing environment is maintainable in only one of the two compartments. The chamber includes at least a first compartment, a second compartment, and a moveable wall which may be positioned over a communication aperture between the two compartments to seal the first compartment and the second compartment from each other.

In one aspect of the invention, the entire compartment in which the process environment is maintained may be removed, and replaced with a clean, previously baked out compartment, thereby enabling faster turnaround when the process compartment requires cleaning. Additionally, if the process chamber is cleaned in place, the moveable wall may be placed over the communication aperture to prevent contact between the cleaning material and the surfaces of the non-process compartment, and to prevent exposure of the non-process compartment to atmospheric conditions when the upper compartment is opened. By isolating the non-process compartment from the cleaning materials and from atmospheric conditions, it is contemplated that shorter bake out times may be possible than in the prior art where the entire chamber had to be baked out after cleaning.

In an additional aspect of the invention, the moveable wall is configured as the wafer support member and is positionable in the second compartment to allow placement of a wafer thereon or removal of a wafer therefrom, and is further positionable within the chamber to seal the aperture between the two compartments and simultaneously to position the wafer thereon within the first compartment for processing.

In a further aspect of the invention, the valve used to throttle the pump orifice may be removed from the chamber without removing the pump, and without exposing the pumping components of the pump to the atmosphere. In another aspect of the invention, the slit valve and/or the wafer handling equipment are provided in the second compartment, so that minimal moveable parts are exposed to the process environment. By isolating the moveable parts in the second compartment, and thus reducing or eliminating the contamination thereof by the process environment, the number of wafer process operations which may occur in the chamber before the moveable parts must be cleaned is increased. In a still further aspect of the invention, the intermediate wafer support for transferring a wafer from the robot arm and onto the support member includes a plurality of pins received in the support member and selectively sealed therewith, and a pin actuator disposed within the second compartment and thereby advantageously isolated from the process environment and its contaminants.

DESCRIPTION OF THE EMBODIMENTS

Figure 1:
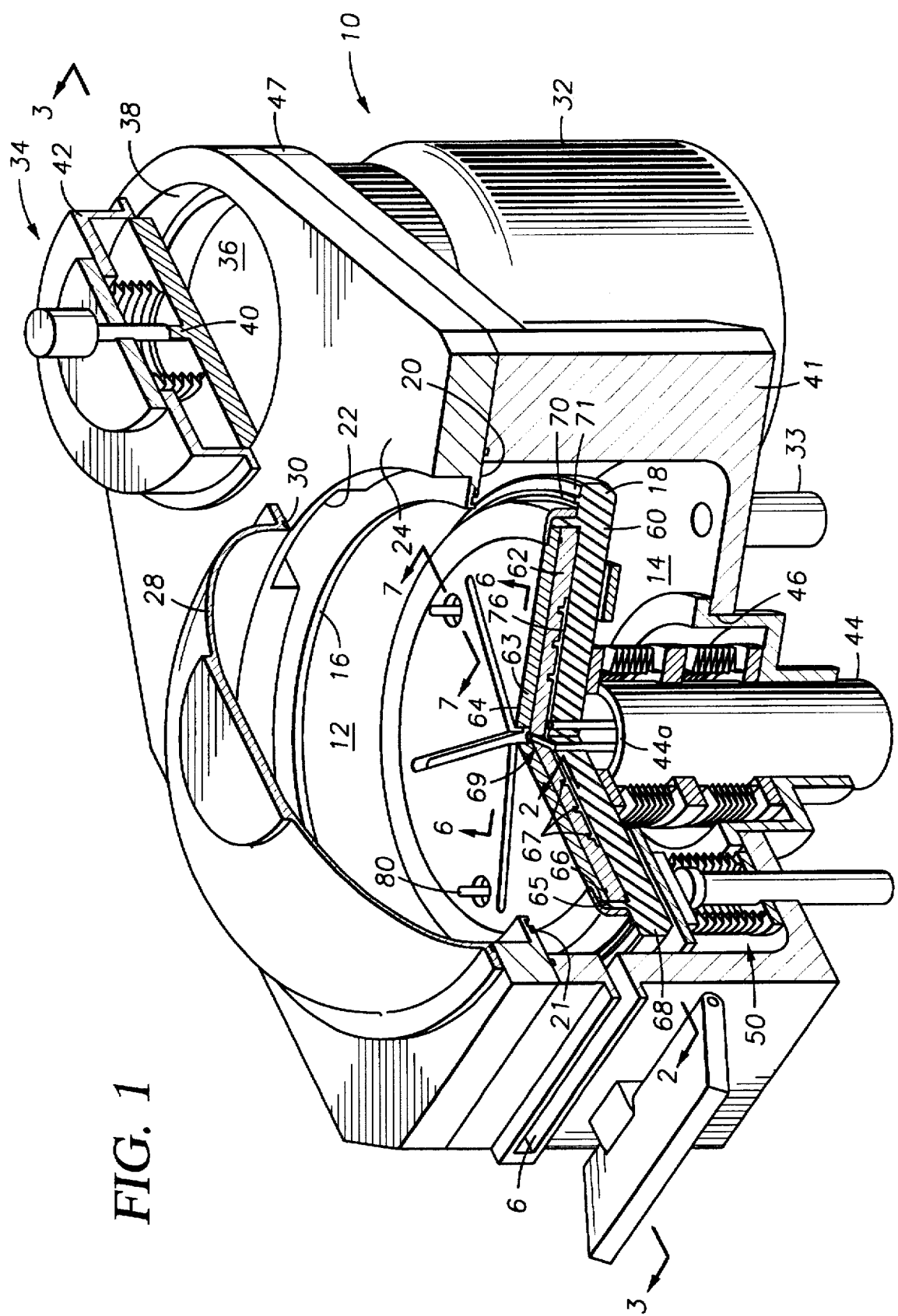
FIG. 1 is a perspective view, partially in section, of the process chamber of the present invention configured as an etch chamber.

The present invention provides a chamber having at least two compartments therein, wherein a process environment is maintainable in only one of the compartments, and the slit valve and wafer handling equipment are located in the other of the compartments. In the preferred embodiment of the invention the chamber as shown at 10 of FIG. 1 includes a first compartment 12 in which the process environment may be maintained, a second compartment 14 located adjacent to, and selectively communicable with, the first compartment 12 through an aperture 16 common to both, and a moveable wall 18 selectively positionable within at least the second compartment 14 to selectively seal the aperture 16 between the first compartment 12 and the second compartment 14. The process environment maintainable in the first compartment 12 may include, but is not limited to, plasma etch processes, physical vapor deposition processes wherein a target is sputtered to provide a deposition material or to enhance a chemical vapor deposition process, or chemical vapor deposition wherein a chemical vapor forms a film layer on the wafer. Both the first compartment 12 and the second compartment 14 are individually sealed enclosures in which a vacuum environment may be maintained. In the preferred embodiment of the invention, the first compartment 12 may be removed from the chamber 10 for cleaning and replaced with a second, identical, first compartment 12. By replacing the first compartment 12 with a clean, previously baked out first compartment 12, the time required to prepare the chamber 10 for the processing of wafers 8 therein is significantly reduced when the chamber 10 requires cleaning.

Both the first compartment 12 and the second compartment 14 are preferably provided as separate sealable enclosures which may be maintained at a hard vacuum, and which are interconnected by a plurality of bolts, or other removable fasteners (not shown). The first compartment 12 preferably includes a base 20 through which the aperture 16 extends for communication between the first compartment 12 and the second compartment 14, an exhaust orifice 22 (best shown in FIGS. 3 to 5), and an upper cover flange 24 over which a seal ring 30 and a cover 28 are received. Preferably, the entire architecture of the first compartment 12 is provided by machining a single piece of stock, such as aluminum, to provide the surfaces and features of the first compartment 12. By machining the first compartment 12 from a single piece of stock, no joints or seams will be present in the body of the first compartment 12 which reduces the number of potential leak paths through the first compartment 12. Where the chamber 10 is configured as a sputtering chamber, the cover 28 includes a target (not shown) mounted thereon, preferably in conjunction with an internal magnet structure (not shown). One such target and magnet structure is shown in U.S. Pat. No. 5,242,566, Parker, the disclosure of which is incorporated herein by reference.

The second compartment 14 preferably includes a tub shaped housing 41 having the chamber slit valve 6 extending therethrough, an upper mounting flange 43 extending about the upper terminus of the tub portion 41 and a pump support flange 47 cantilevered outwardly from the tub portion 41. The second compartment 14 does not include a separate cover. Instead, the underside of the base 20 of the first compartment 12 is received over the upper mounting flange 43 and the pump support flange 47. The portion of the base 20 received over the upper mounting flange 43 forms the top of the second compartment 14, such that the aperture 16 is disposed to communicate with both of the compartments 12, 14. A seal ring is disposed in a seal groove 21 extending about the periphery of the upper mounting flange, to provide a seal extending about the aperture 16 and sealing the underside of the base 20 to the upper mounting flange 43.

Figure 3:
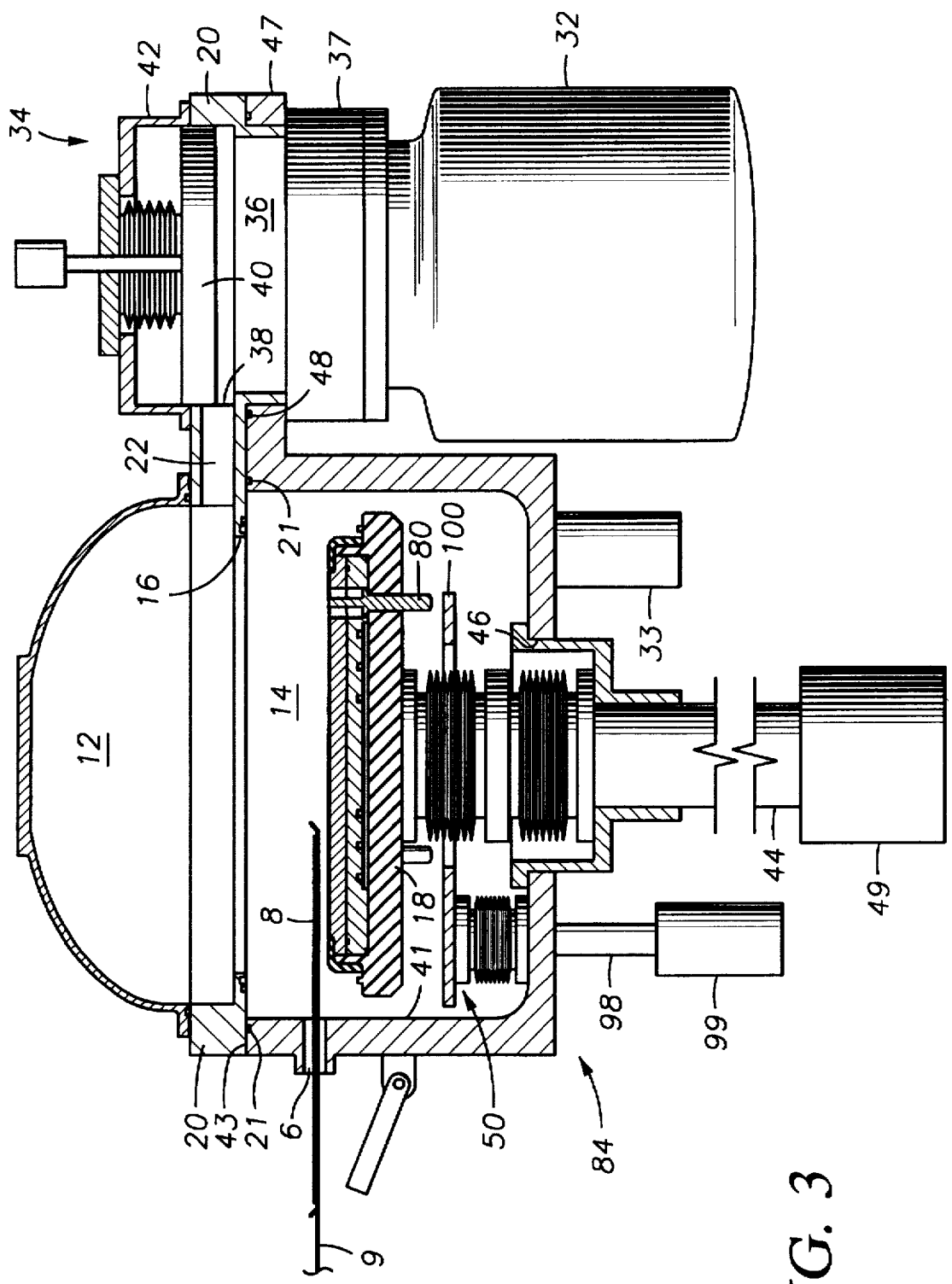
FIG. 3 is a sectional view of the process chamber of FIG. 1.
Figure 4:
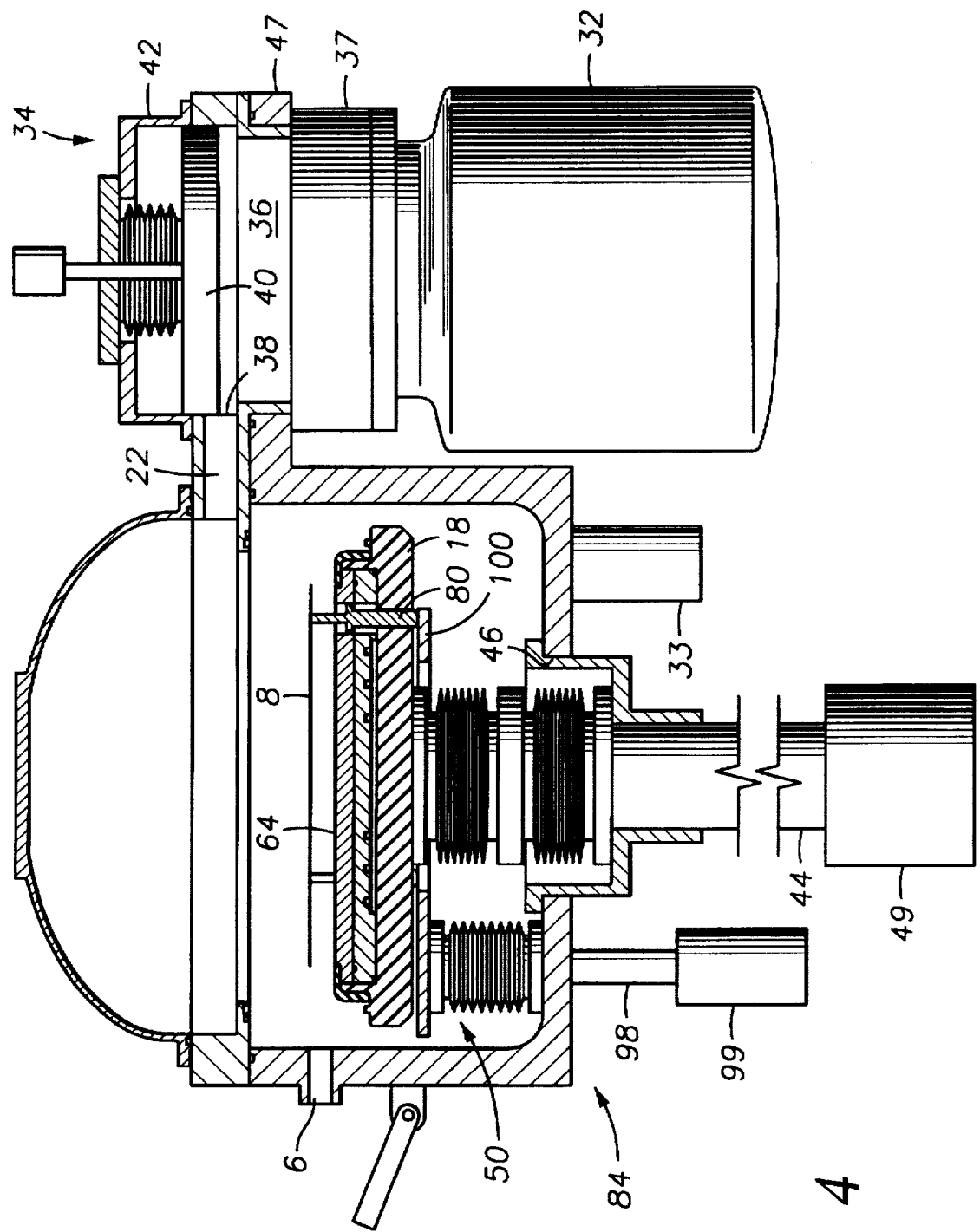
FIG. 4 is a sectional view of the process chamber of FIG. 1, wherein the wafer handling member is positioned to support the wafer in the chamber.
Figure 5:
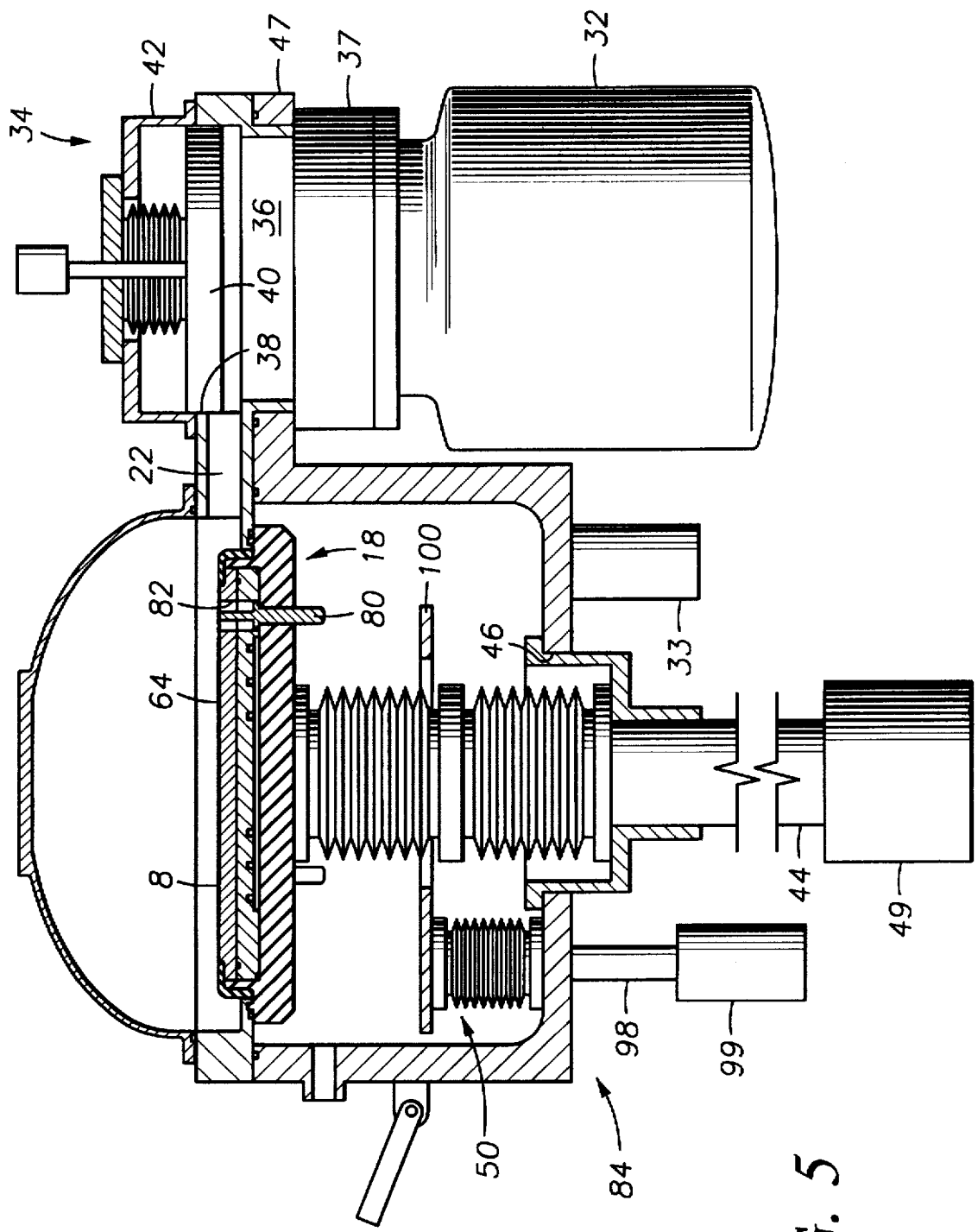
FIG. 5 is a sectional view of the process chamber of FIG. 1, wherein the moveable wall has been positioned to isolate the process environment from certain portions of the chamber.

To maintain a vacuum pressure in the chamber 10, a pump 32, such as a turbo molecular or cryogenic pump, is fluidly coupled to the exhaust orifice 22 through a gate valve 37 which may be positioned to isolate the pump 32 from the exhaust orifice, and a poppet valve 34 is communicable with the exhaust orifice 22 to throttle the pump 32. As best shown in FIG. 3 to 5, the exhaust orifice 22 includes a pump aperture 36 communicable with a gate valve 37 and the pump 32, and a poppet valve aperture 38, facing the pump aperture 36, into which a poppet valve 34 is mounted. The gate valve 37 is provided to selectively seal the pump 32 from the chamber 10. The poppet valve 34 includes a plate 40, which extends from an actuator in the poppet valve housing 42, to block selected portions or a portion of the cross section of the exhaust orifice 22. By blocking selected portions of the exhaust orifice with the plate 40, the poppet valve 34 is used as a throttle valve to throttle the exhaust orifice. The pump 32 and the gate valve 37 are mounted to the pump support flange 47, but the exhaust orifice 22 is formed entirely by the upper compartment 12. The exhaust orifice wall, specifically the pump aperture portion 36 thereof, is preferably sleeved into the pump support flange 47 such that when the base 20 of the first compartment 12 is removed from the chamber 10 the pump 32 may remain in place on the underside of the pump support flange 47 but the exhaust orifice 22 may be removed for cleaning and/or replacement. A seal ring is provided in a groove 48 in the pump flange, and seals the interface between the pump support flange 47 and the pump aperture 36. By mounting the poppet valve 34 on a separate aperture from that with which the pump 32 communicates, the poppet valve 34 and the pump 32 may be separately serviced or removed from the chamber 10. Further, by closing the gate valve 37, the pump 32 may be isolated from the first compartment 12 when the first compartment is cleaned or when the poppet valve 34 is serviced, and the first compartment may be isolated from exposure to atmosphere when the pump 32 is removed.

The pump 32 is preferably capable of pumping both compartments 12, 14 down to pressures in the $10^{-7}$ tort range when the moveable wall 18 is retracted into the second compartment 14 to permit communication between the second compartment 14 and the pump 32. Once the chamber 10 is pumped to this low pressure, the moveable wall 18 is positioned, as will be described further herein, to isolate the second compartment 14 from the first compartment 12. A process gas is then flowed into the first enclosure 12 through a gas inlet having a mass flow controller (not shown) such that the flow rate of the gas into the first compartment 12, and the pumping rate of the gas from the first compartment 12 by the pump 32, are controlled to provide a desired concentration and pressure of the process gas in the first compartment 12. The gas may, if desired, be utilized to deposit a film layer on wafer 8 with or without being energized into a plasma; or it may be energized into a plasma to etch a film layer or to sputter a target in the first compartment 12 to provide material to form a deposition layer on the wafer 8. Once the depositing or etching of a film layer on the wafer 8 is completed, the pump 32 evacuates the first compartment 12 to equalize the pressure in the two compartments 12, 14, and remove the process gases and potential contaminants and the moveable wall 18 may then be moved to link the two compartments 12, 14 again through the aperture 16.

When the chamber 10 is configured to provide a plasma process environment, for example to perform etch, in the first compartment 12, and the pressure in the second compartment 14 approaches or exceeds that of the first compartment 12, a plasma could undesirably form in the second compartment 14. The pressure in the second compartment 14 could approach or exceed, that of the first compartment 12 where the chamber slit valve 6 leaks and allows gases present in an adjacent transfer chamber, or in a wafer loading cassette attached to the exterior of the chamber 10 at the slit valve 6, to enter the second compartment 14. To ensure that the second compartment 14 pressure is less than that of the first compartment 12, and thereby ensure that the gases therein are not excited into a plasma, a secondary vacuum pump 33 may be ported to the second compartment 14.

Referring still to FIG. 1, the moveable wall 18 is supported within the second compartment 14 by a hollow stem 44 extending through a sealed aperture 46 in the base of the tub shaped housing 41. The sealed aperture 46 preferably includes a bellows extending from the underside of the moveable wall 18 to the base of the second enclosure 14 to protect the stem 44 if any process environment materials should enter the second compartment 14 and to provide additional sealing between the second compartment 14 and the exterior of the chamber 10. The stem 44 is coupled, on the exterior of the housing 41, to a drive member 49 (shown in FIGS. 3 to 5) such as a hydraulic or pneumatic piston, a lead screw coupled to a stepper motor, or other drive apparatus. The stem 44 is positioned by the drive member 49 to position the moveable wall 18 in a retracted position, as shown in FIGS. 1 and 3, and an extended position as shown in FIG. 5. The interior of the stem 44 is configured to supply utilities, such as gases, coolants and electricity to the moveable wall 18 as required by the process application of the chamber.

Figure 2:
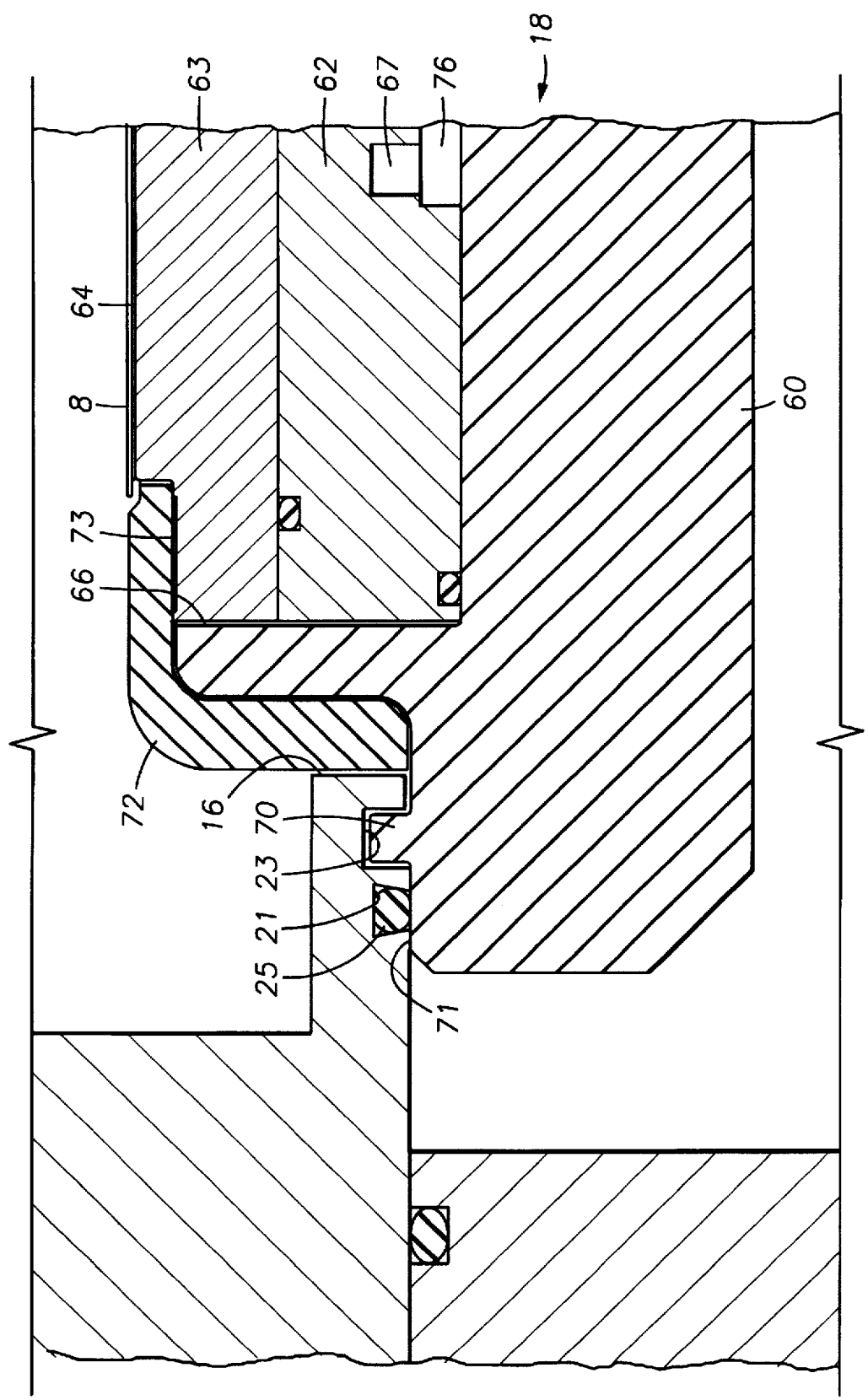
FIG. 2 is a partial sectional view of the process chamber of FIG. 1.

Referring now to FIGS. 1 and 2, the details of construction of the moveable wall 18 and the sealing engagement of the moveable wall 18 with the base 20 of the first compartment 12 to seal the aperture 16, are shown. In the preferred embodiment of the multiple compartment configuration shown in the Figures and described herein, the moveable wall 18 is configured for etching of a film layer on the wafer 8. To cause the plasma to etch the film layer on the wafer 8, the moveable wall 18 must be configured as a cathode, i.e., a negative voltage must be maintainable on the moveable wall 18 with respect to the enclosure formed by the first compartment 12 which is preferably grounded. However, the moveable wall 18 must also be isolated from the walls of the two compartments 12, 14, to prevent grounding of the conductive portion of the moveable wall 18. Therefore, the moveable wall 18 includes an outer, electrically insulative base 60, an intermediate conductive member 62 to electrically bias the moveable wall 18 as a cathode, a pedestal 63 mounted over the conductive member 62, and an electrostatic chuck 64 received on the pedestal 63.

The insulative base 60 of the moveable wall 18 is received on the upper end 44a of the stem 44 and is preferably a cylindrical member configured to be received partially within the aperture 16, and partially against the underside of the base 20 of the first compartment 12 adjacent to the aperture 16, when the moveable wall 18 is positioned in its extreme extended position as shown in FIG. 5. The insulative base 60 includes an upper cylindrical recess 66 bounded by an annular wall 65 and a circumferential seal flange 68 extending outwardly from the lower terminus of the annular wall 65. The seal flange 68 includes an annular upwardly extending lip 70 thereon, and an annular sealing surface 71 extending from the lip 70 to the edge of the insulative base 60. The conductive member 62 is received within the recess 66, and the pedestal 63, with an electrostatic chuck 64 attached to the upper surface thereof, is bolted or otherwise firmly attached to the conductive member 62. When the moveable wall 18 is positioned in the extended position for the processing of the wafer 8 in the first compartment 12, the annular wall 65 extends partially inwardly of the first compartment 12 and the aperture 16, and the wafer 8 is received over the electrostatic chuck 64 as shown in FIG. 2. To seal the engagement of the insulative base 60 against the underside of the base 20, a seal groove 21 having a dovetail profile is provided in the underside of the base 20 and extends around the periphery of the aperture 16, and an o-ring or other type of seal 25 is received therein as best shown in FIG. 2.

During processing, the moveable wall 18 is in its extreme extended position as just described, and supports the wafer 8 within processing first compartment 12 while sealing compartment 12. Both wafer 8 and portions of the moveable wall 18 thus can be exposed to the process environment maintained in the first compartment 12. To protect the exposed portions of the moveable wall 18 from the process environment, a shroud 72 extends from the seal flange 68 upwardly over the outer surface of the annular wall 65 and terminates inwardly of the outer edge of the pedestal 63 within an annular groove 73 disposed in the upper, outer, edge of the pedestal 63.

To properly secure the wafer to the moveable wall, to maintain the wafer 8 at an acceptable temperature, and, in the case of plasma etching, to provide the electric power to energize gases in the first compartment 12 into a plasma, the moveable wall 18 must be supplied with different utilities. Typically the utilities include coolants, and electrical power for an electrostatic chuck and/or an auxiliary electric resistance heater. Alternatively, a vacuum line may be extended to the moveable wall 18 for vacuum chucking of a wafer 8. Preferably, the utility connections to the moveable wall 18 are provided through the hollow interior of the stem 44, as disclosed in U.S. Pat. No. 5,228,501, Tepman, et al., incorporated herein by reference.

Where the chamber 10 is configured as an etch chamber, the wafer 8 and the moveable wall 18 typically must be cooled to remove the heat transferred into the wafer 8 from the etch plasma. Therefore, in an etch application, the conductive member 62 preferably includes cooling passages 67 through which a coolant such as water is flowed, and the electrostatic chuck 64 includes a plurality of coolant grooves (not shown) therein, into which a backside cooling gas is flowed from a gas supply arrangement 69 passing through the insulative base 60, the conductive member 62 and the pedestal 63. In the embodiment of the invention shown in FIG. 1, the coolant grooves are provided by machining a plurality of circular grooves (e.g., 67) and at least one radial distribution groove into the underside of the conductive member 62, and fixing a plate 76, having coolant supply and coolant return apertures extending therethrough, over the underside of the conductive member 62. Conventional cooling channel and backside gas distribution systems useful with the present invention are disclosed in U.S. Pat. No. 4,842,683, Cheng, et al., the disclosure of which is incorporated herein by reference. As referenced above, the gas and coolant lines to supply the utilities for these features are extended through the stem 44.

Where the chamber 10 is used for chemical vapor deposition or physical vapor deposition, a heating element (not shown) may be located within the conductive member 62 to heat the wafer 8 to enhance the properties and distribution of the deposited film layer. One such heater arrangement suitable for use with the present invention is an electric resistance heater arrangement shown in U.S. Pat. No. 5,228,501, Tepman et al., the disclosure of which is incorporated herein by reference. Again, the power connection for this heater is preferably provided by extending a power cable (not shown) through the hollow interior of the stem 44.

Figure 6:
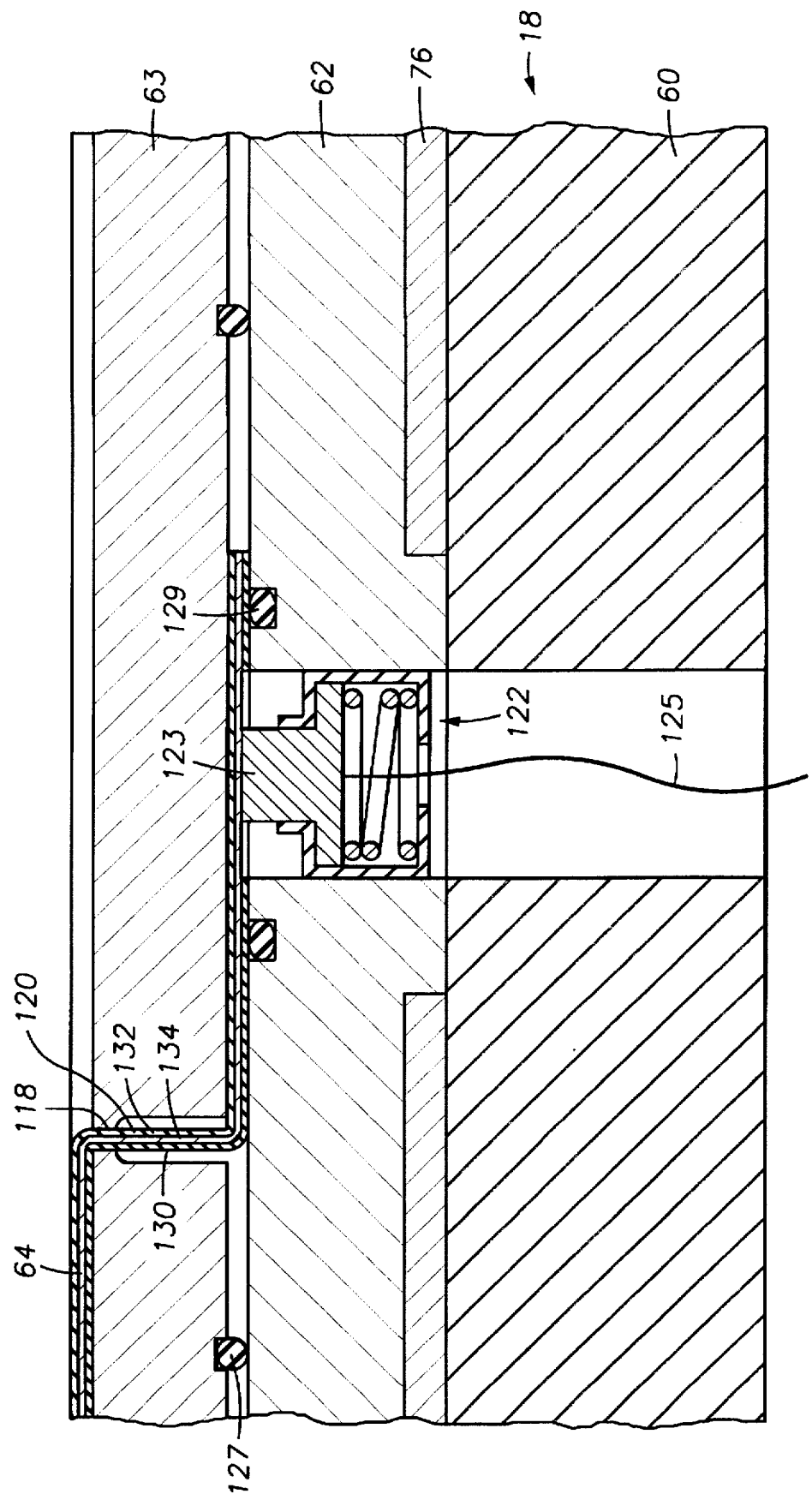
FIG. 6 is a partial sectional view of the moveable wall of the chamber of FIG. 1, showing the power connection of the electrostatic chuck.

Referring now to FIG. 6, to supply electrical power to the electrostatic chuck 64, a strap 120 is extended from the electrostatic chuck 64 and through an aperture 118 in the pedestal 63 where it is attached to the underside of the pedestal 63 with an adhesive. This strap 120 is connected to a pin connecter 122 disposed within a pin connecter bore extending through the conductive member 62, which pin connector 122 includes a contact pin 123 received therein and contacted with the conductive portion of the strap 120. A power supply lead 125 extends through the hollow interior of the stem 44 (not shown in FIG. 6) and an aperture in the insulative base 60 to feed the electrical power to the pin connector 122. Preferably the electrostatic chuck 64 is a thin flexible planar member having a central thin film conductive core 134 encapsulated within dielectric layers 130, 132, and the strap 120 is an extension of the core 134 and electrostatic layers 130, 132. To provide a continuous electric contact between the pin connector 122 and the strap 120, the dielectric layer 130 of the strap 120 is removed to expose a portion of the core 134 thereof, and this exposed portion is aligned with the contact pin 123 of the pin connector 122. The aperture 118 in the pedestal 63 provides a potential leak path from the first compartment to atmosphere and from the backside of the wafer to the space between the conductive member 64 and the pedestal 63. Therefore, a seal ring 127 extends circumferentially around both the pin connector 122 in the conductive member 64 and the aperture 118 through the conductive member at the interface of the pedestal 63 and the conductive member 64, and a second seal ring 129 is disposed about the outer perimeter of the pin connector bore and seals the underside of the pedestal 63 with the strap 120 and the conductive member 62 at the periphery of the pin connector bore.

Referring again to FIGS. 1 and 3 to 5, the moveable wall 18 must provide a complete seal between the first compartment 12 and the second compartment 14. Therefore, it is preferable that the movable wall 18 be a solid, sealed member. Where the intermediate wafer support 50 (best appreciated from FIGS. 3 to 5) is configured as an horseshoe shaped member through which the stem of the moveable wall 18 may pass to pick up, or disgorge, the substrate, the only connection through the moveable wall 18 will be the sealed connection for the electrostatic chuck 64 electric feed. However, the preferred intermediate wafer support 50 requires the use of support pins 80 selectively extending through the moveable wall 18 to assist in the transfer of the wafer 8 from the robot blade 9 onto the moveable wall 18, and the electrostatic chuck power connection, the heater power supply (where used), the coolant connection, the power connection to bias the conductive member 62 as a cathode (not shown) and the backside cooling gas connection provide potential leak paths between the first compartment 12 and the second compartment 14. By providing the electrical power, gas and coolant connections for the moveable wall 18 through the stem 44, any leak path through these connections will communicate between the exterior of the chamber 10 and the first compartment 12. Additionally, the sealing of the pin conductor bore, and the interface of the pedestal 63 and the conductive member 62 around both the pin connecter bore and the strap aperture 118, prevents leakage through the strap aperture 118. However, the apertures in the moveable wall 18 through which the pins 80 extend provide a potential direct leak path between the first compartment 12 and the second compartment 14. Therefore the pins 80 must be sealable within the moveable wall 18.

Figure 7:
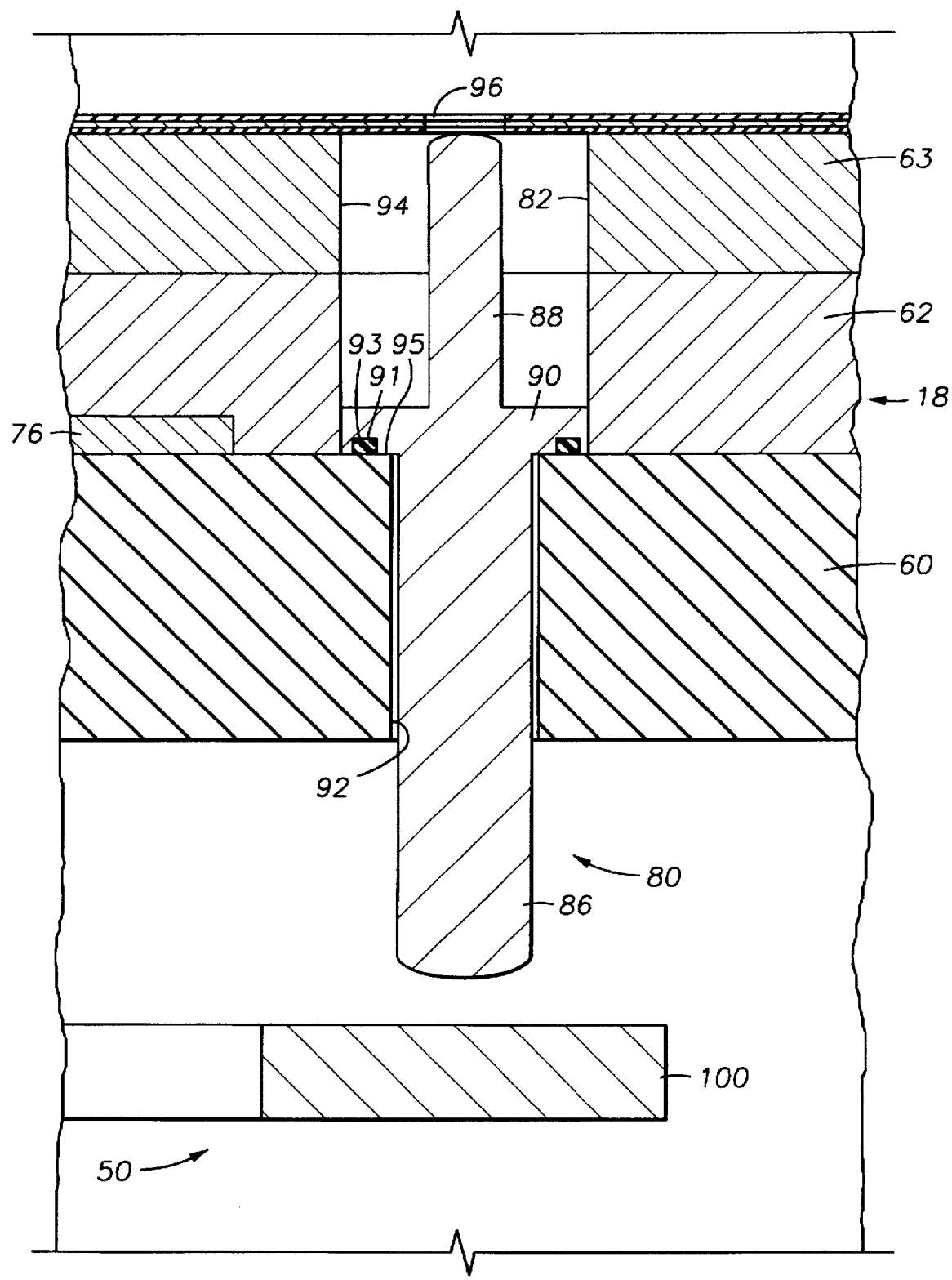
FIG. 7 is a partial sectional view of the moveable wall of the chamber of FIG. 1 showing the preferred configuration of the wafer support pins.

Referring now to FIGS. 3 and 7, the preferred configuration of the intermediate wafer support 50, including the pins 80, is shown. In the preferred embodiment of the invention the intermediate support member 50 includes the plurality of support pins 80 (only one shown in FIG. 7) received in bores 82 in the moveable wall 18, and a pin actuator 84 (shown over its entire length in FIG. 3) received between the moveable wall 18 and the base of the second compartment 14. The pin actuator 84 cooperates with the pins 80 and the moveable wall 18 to extend the pins 80 from the moveable wall 18 to support a wafer 8 above the moveable wall 18 and on the pins 80 as shown in FIG. 3, and retract the pins 80 inwardly of the moveable wall 18 to position the wafer 8 on the electrostatic chuck 64 as shown in FIG. 5.

As best shown in FIG. 7, each of the pins 80 includes a lower major diameter stem 86, an upper minor diameter stem 88, and an intermediate flange 90. The aforementioned bores 82 in the moveable wall 18 are configured to allow restrained, vertical movement of the pins 80 in the moveable wall 18. Each bore 82 includes a minor diameter portion 92 extending through the insulative base 60 of the moveable wall 18 and in which the major diameter stem 86 is received, a major diameter portion 94 extending through the conductive member 62 in which the intermediate flange 90 is received, and an upper portion 96 extending through the electrostatic chuck 64 and through which the minor diameter stem 88 is received. The intersection of the minor diameter portion 92 and the major diameter portion 94 forms an annular seal ledge 95. The relative sizes of the portions 92, 94 and 96 of the bores 82 limits the vertical movement of the intermediate flange 90 in the bore 82, and thus limits the total vertical movement of the pins 80. To selectively seal the bores 82, a seal groove 91 extends inwardly of the underside of the intermediate flange 90, and a seal ring 93, such as an o-ring seal, is disposed in the seal groove 91 to seal against the annular seal ledge 95 when the pins 80 are retracted into the moveable wall 18.

Referring now to FIGS. 3, 4 and 5, the pin actuator 84 includes a pin drive member 99 disposed on the exterior of the base of the second enclosure 14, a drive shaft 98 extending through the a sealed connection in the base of the second enclosure 14, and a pin positioning plate 100 located intermediate of the moveable wall 18 and the base of the second enclosure 14. A bellows is also provided about the drive shaft 98 and it extends from the base of the second compartment 14 to the underside of the pin positioning plate 100 to further seal the sealed connection of the drive shaft 98 through the base of the second compartment 14 and provide a protective barrier around the portion of the drive shaft 98 received within the second compartment 14. The pin drive member 99 may be a hydraulic or pneumatic cylinder, a lead nut on a rotating lead screw, a worm drive or other apparatus capable of positioning the pin positioning plate 100 at various vertical positions within the first enclosure 14.

Referring still to FIGS. 3, 4 and 5, the operation and cooperation of the pins 80 and the pin actuator 84 are shown. Referring first to FIG. 3, the moveable wall 18, with the pins 80 therein, is shown for positioning of a wafer 8 in the chamber 10 by the support blade 9, or the removal of a wafer 8 from the chamber 10 by the support blade 9. In this position, the pin positioning plate 100 is fully retracted to the base of the second compartment 14 by the pin drive member 99, and the moveable wall 18 is retracted below the position where the slit valve 6 extends through the second enclosure 14. With the moveable wall 18 and pin positioning plate 100 in this retracted position, the top of the pins 80, and the top of the moveable wall 18, are positioned below the slit valve 6 so that the robot blade 9 may move freely inwardly and outwardly of the second compartment 14 to position a wafer above the moveable wall 18 as shown in FIG. 3.

Once the wafer 8 is positioned in the second compartment 14 above the moveable wall 18, the pin drive member 99 moves the pin positioning plate 100 inwardly of the second compartment 14 to move the pins 80 upwardly to the position shown in FIG. 4 and thereby lift the wafer 8 from the robot blade 9 and onto the pins 80. Then, with the wafer 8 supported over the moveable wall 18 on the pins 80, the support blade 9 is retracted from the second enclosure 14. Once the support blade 9 is cleared from the second enclosure 14 the moveable wall 18 moves upwardly on the pins 80 while the pin positioning plate 100, and thus the pins 80, remain stationary, and the pins 80 become recessed into the moveable wall 18 as the moveable wall 18 moves upwardly in the second compartment 14. The moveable wall 18 then continues to move to its extreme extended position shown in FIG. 5, to position the wafer 8 in the first compartment 12 for processing. Once the wafer 8 is resting on the electrostatic chuck 64 which forms the uppermost surface of the moveable wall 18, the pins 80 have moved under their own weight down to the bottom of pin bore 82 to become fully recessed into the apertures 82 in the moveable wall 18. Also, with the pins 80 recessed into the moveable wall 18, the seal 93 in the underside of the pin flange 90 engages against the annular seal flange 95 within the bore 82 as shown in FIG. 7 to seal the pin bore 82. The pin 80 is of sufficient mass to seal against the annular seal flange 95 in the pin bore 82 despite slight differences in pressure in the first compartment 12 and the second compartment 14. Thus, the seals 93 in the bores 82, in conjunction with the engagement of the seal 25 received in the underside of the base 20 with the sealing surface 71 of the seal flange 68 of the insulative base 60 and the sealing of the strap aperture 118, enable a complete seal between the two compartments 12, 14 when the moveable wall is positioned in the extended position as shown in FIG. 5. Further, the underside of the first compartment base 20 includes an annular recess 23 located between the seal groove 21 and the aperture 16. Thus, when the moveable wall 18 is located against the underside of the base 20 of the first compartment 12, the annular lip 70 extending upwardly from the moveable wall 18 extends into the annular recess 23 in the underside of the first compartment 12 to isolate the seal 25 from the aperture 16 and thereby prevent any particles or other contaminants that may fall from the first enclosure 12 downwardly onto the seal flange 68 from coming into contact with the seal 25.

Figure 8:
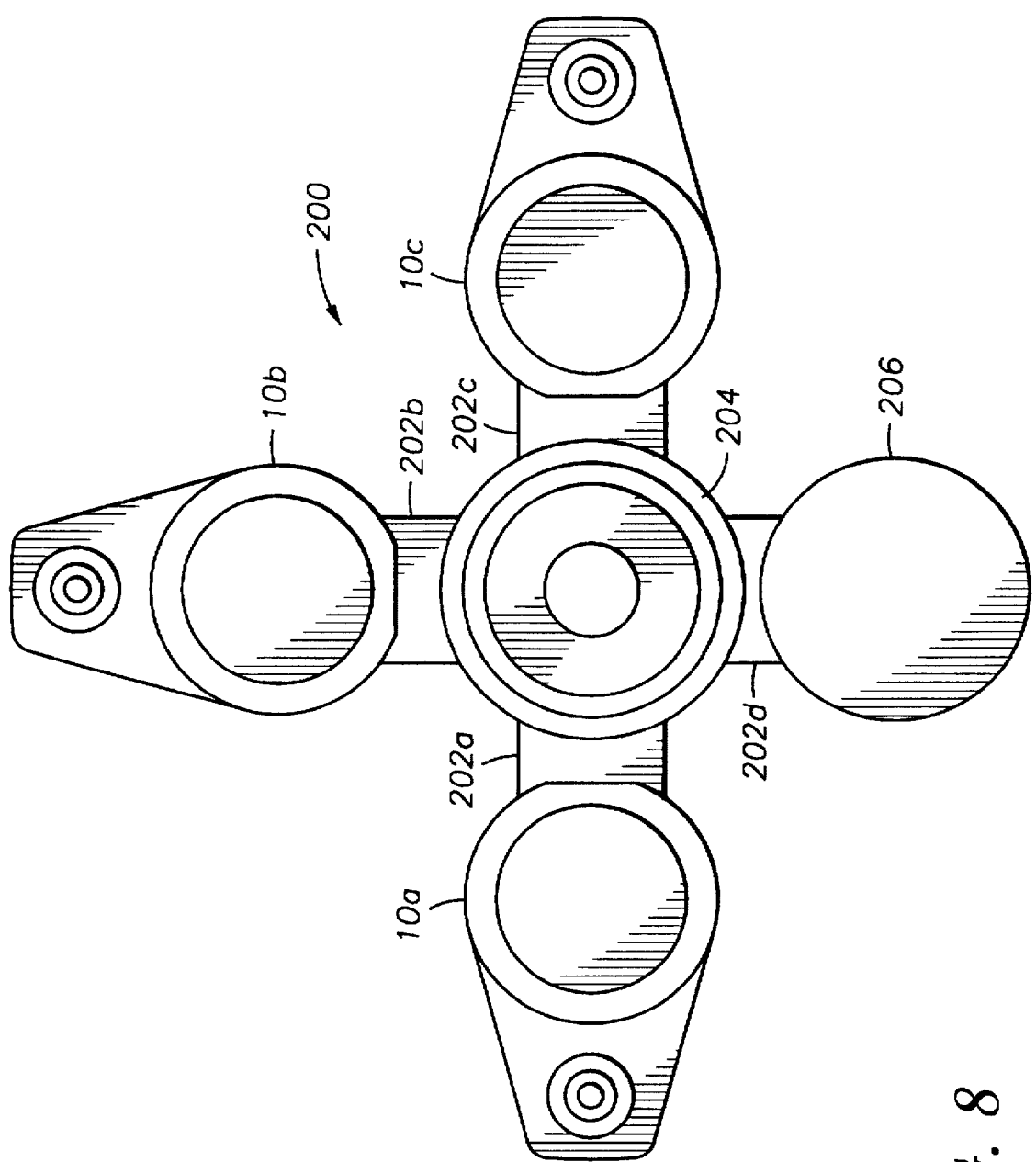
FIG. 8 is a simplified schematic top view of a cluster tool utilizing a plurality of the compartmentalized substrate processing chambers of the present invention.

Referring now to FIG. 8, a simplified view of a cluster tool implementation of the present invention is shown. The cluster tool 200 includes a plurality of chambers 10a–c, each of which is identical to the processing chamber 10 of the above-described figures. Each is coupled, through corresponding loadlocks 202a–c, to a transfer chamber 204. Each of the loadlocks 202a–c align with the respective chamber slit valve 6 (not shown in FIG. 8) of each of the compartmentalized process chambers 10a–c. The transfer chamber 204 is also coupled, through a loadlock 202d, to a loadlock chamber 206.

Each of the individual compartmentalized process chambers 10a–c and the transfer chamber 204 of the cluster tool 200 are preferably maintained at a vacuum pressure during wafer processing. Preferably, the pressure in the transfer chamber 204 may be maintained independently of the pressure in any one of the compartmentalized process chambers 10a–c, by providing a vacuum pump (not shown) for the transfer chamber 204. Additionally, the load lock chamber 206 may be opened to atmosphere while isolated from the transfer chamber by a slit valve or other gate device (not shown) for the loading of a substrate into the cluster tool 200, and then pumped down to an acceptable vacuum pressure by a dedicated vacuum pump (not shown).

During the processing of substrates in the compartmentalized processing chambers 10a–c, the slit valves 6 (shown in FIG. 1) of the compartmentalized process chambers 10a–c are preferably maintained in a closed position. By maintaining the slit valve 6 in the closed position, gases in the transfer chamber 204 cannot migrate or flow into the second compartments 14 (shown in FIG. 1) and the pressure in the second compartments 14 of the chambers 10a–c may be maintained below the pressure in the first compartments 12 to ensure that a plasma does not form in the second compartments 14 where the compartmentalized chambers 10-c are configured as etch chambers. However, if the transfer chamber 204 is maintained at a pressure sufficiently low, with respect to the process pressures maintained in the compartmentalized chambers 10a–c, then the slit valves 6 may remain open throughout the use of the cluster tool 200, and they need be closed only during the replacement of the second compartments 12.

The configuration of the chamber 10 as including a first compartment 12 in which the process environment is maintained, and a second compartment 14 in which the intermediate wafer support 50 is deployed, enables a significant improvement in the turnaround time for cleaning the chamber compared with the turnaround time for cleaning prior art chamber configurations. For example, the ability to quickly replace the first compartment 12 with a clean, pre-baked out, first compartment 12 significantly reduces the chamber downtime for cleaning. Additionally, when the moveable wall 18 is cleaned, or where the first compartment 12 is to be cleaned without being removed, the cleaning materials or processes can be maintained in the first compartment 12 by simply moving the moveable wall 18 to its extreme extended position. The portions of the moveable wall exposed to the plasma, and thus in need of cleaning, will be positioned within the first compartment 12. Thus, no, or minimal, water or other cleaning materials will contact the surfaces of the second compartment 14. The position of the throttling poppet valve 34 to allow servicing of the pump 32 separately from the throttling poppet valve 34 likewise decreases the down-time associated with chamber cleaning. Further, the insulative base 60, shroud 72 and electrostatic chuck 64 are preferably fabricated from non-water absorbing materials, so that these components need not be baked out after cleaning. Therefore, the cycle time for cleaning the chamber 10 and returning it to production is reduced from over 8 hours to the time period necessary to clean the moveable wall 18, replace the first compartment 12, and reestablish any connections to the first compartment 12. Further, the placement of the slit valve 6 through the second compartment 14 wall protects the slit valve 6 from exposure to the process environment. Therefore, the slit valve 6 does not require the periodic cleaning as is necessary with the prior art chambers. Additionally, because the moveable wall 18 seals the second enclosure 14 from the process environment, the slit valve 6 may not need to be closed during the processing of a wafer 8, particularly where non-etch environments are run in the first compartment, and it must be closed only when the chamber 10 is being serviced for cleaning. Thus, the slit valve 6 will be opened and closed far fewer times than in prior art chambers, and thus will require minimal servicing. Also, because the slit valve 6 is not exposed to the process environment and does not require the periodic cleaning necessitated by the construction of the prior art chambers, any other chambers linked to the processing chamber 10 through a transfer chamber 204 need not be shut in while one of the processing chamber 10 is cleaned. Finally, the maintenance of a process chemistry clean environment within the second compartment 14 will extend the life of the second compartment 14, the slit valve 6 and the intermediate wafer support 50, and the drive mechanism for the moveable wall 18 because these components will not be subject to corrosive attack or contaminants from the process gases and plasmas.

The maintenance of the intermediate wafer support 50 in the second compartment 14 also enables design changes in the process compartment, i.e., the first compartment 12, to reduce distortion in the electric field where the chamber 10 is used for plasma processes such as plasma etch or sputtering. For example, the absence of the asymmetrical intermediate wafer support 50 from the immediate vicinity of the electric field used to support a plasma process environment reduces the asymmetries in the electric field which would otherwise be present in the chamber. Additionally, the first compartment 12 may be made substantially symmetrical, such as by providing complete symmetry of the second enclosure surfaces such as the walls, cover 28 interior surface and moveable wall 18 surfaces about a vertical axis, to reduce electric field distortion in the plasma without the need to compensate for the asymmetric intermediate wafer support 50. This may be accomplished by placing the exhaust orifice 22 through the central top area of the cover 28, thereby eliminating the cantilevered extending exhaust orifice 22 as shown in the Figures. Additionally, the gas supply would be provided by forming a circumferential channel in the cover 28. By modifying the second enclosure 12 in this way, and providing a moveable wall 18 that is symmetrical about the longitudinal axis of the stem 44, the first compartment will provide a symmetrical volume, at the base of which the moveable wall 18 and wafer 8 may be placed, to enhance even distribution of the process gases and the electrical field about the wafer 8.

The specific configuration of the chamber 10 to provide the separate first compartment 12 in which the process environment may be maintained, and a second compartment 14 which is isolated from the first compartment 12 during processing, may be varied to address specific requirements of the process or the chamber. For example, the moveable wall 18 might be hinged to selectively open or close the aperture 16. Alternatively, the positions of the compartments may be inverted, so that the lower compartment receives the process environment and the moveable wall 18 moves downwardly to seal the aperture between the compartments. Likewise, the compartments may be placed side by side with the aperture through adjacent side walls of the compartments, so that the moveable wall moves horizontally to seal the aperture. Additionally, processes other than those specifically set forth herein may benefit from a multiple compartment chamber.

We claim:

1. An apparatus for processing substrates, comprising:
   a first compartment for maintaining a substrate processing environment therein, said compartment having a base;
   a second compartment having a moveable substrate support member therein;
   a common aperture between said first compartment and said second compartment, said common aperture through said base being selectively sealable by a seal between said substrate support member and said base to isolate the process environment in said first compartment; and
   said first compartment including said base being removable and replaceable with an additional first compartment and base.

2. The apparatus of claim 1, wherein said first compartment includes a cover which is a one-piece removable element.

3. The apparatus of claim 1, wherein a portion of said base forms a common wall between said first compartment and said second compartment, and said common aperture extends through said common wall.

4. The apparatus of claim 3, wherein said substrate support member is positionable at a retracted position to expose the contents of said second compartment to the environment maintainable in said first compartment, and in a extended position whereby said substrate support member contacts and seals to said common wall and blocks said common aperture to isolate said first compartment from said second compartment.

5. The apparatus of claim 1, wherein said additional first compartment and base is cleaned and baked out before assembly into the chamber.

6. The apparatus of claim 1, which further includes a pump flange common to said first and second compartments and defining an exhaust passageway for said first compartment, said pump flange terminating in a pump aperture and a valve aperture, said pump flange being adapted to mount a vacuum pump communicating with said pump aperture, said pump flange being further adapted to mount a first valve having an element moveable into and out of said passageway to block at least a portion of said passageway between said first compartment and said pump.

7. The apparatus of claim 6, which further includes a second valve positioned between said pump flange and said pump, to seal the pump when the first valve, the first compartment, or both, are removed, or to seal the first valve and the first compartment when the pump is removed.

8. The apparatus of claim 1, further including:
a support flange extending from said second compartment, said flange defining an exhaust orifice for said first compartment, said exhaust orifice terminating in a pump aperture and a valve aperture defined in said support flange,
said support flange being adaptable to support a vacuum pump in communication with said pump aperture, and a valve in communication with said valve aperture capable of partially or fully blocking the exhaust passageway between the pump and the first compartment.

9. The apparatus of claim 8, in which said pump aperture and said valve aperture are aligned, and said support flange is adapted to mount said valve and said pump in opposed relationship.

10. The apparatus of claim 1, wherein said second compartment includes a substrate loading aperture.

11. The apparatus of claim 10, in which a gate valve is provided in association with said loading aperture to open and close said loading aperture, said second compartment being sealable by said gate valve together with the substrate support member so that said gate valve need not be exposed to the substrate processing environment.

12. The apparatus of claim 10, further including:
a substrate transfer chamber coupled to said second compartment at said loading aperture; and
a second processing chamber coupled to said transfer chamber;
whereby said loading aperture may be maintained in an open position during the processing of a substrate in the first compartment.

13. The apparatus of claim 12, further including a gate device adjacent said loading aperture and selectively positionable to seal said loading aperture from either of said first and second compartments.

14. The apparatus of claim 1, in which a drive member is provided within said second compartment to move said moveable substrate support member.

15. The apparatus of claim 1, wherein said substrate support member is positionable in a first position permitting a substrate to be extended through said loading aperture to position the substrate on, or to remove a substrate from, said second compartment, and a second position such that said substrate support member seals said common aperture to isolate said first compartment from said second compartment and positions the substrate in said first compartment for processing.

16. The apparatus of claim 15, wherein said substrated support member includes a cathode therein.

17. The apparatus of claim 1, wherein an etch process environment may be maintained in said first compartment.

18. The apparatus of claims 1, wherein a physical vapor deposition process environment may be maintained in said first compartment.

19. The apparatus of claim 1, wherein a physical vapor deposition process environment may be maintained in said first compartment.

20. The apparatus as in claim 1,
wherein said first compartment including said base is sealed to said second compartment through at least one O-ring sealing a gap between a set of mating surfaces between said first compartment and base and said second compartment.

21. A substrate processing chamber assembly comprising:
first compartment having a base;
a second compartment, said first and second compartments having a common boundary therebetween formed from a portion of said base provided with a first aperture therethrough, said second compartment being provided with a second aperture spaced from said first aperture to enable a substrate to be introduced into and removed from said second compartment;
a substrate support member disposed within said second compartment, said support member being moveable generally between a first position and a second position, said support member, when positioned in said first position, being positioned to receive a substrate thereon via said second aperture, said support member, when positioned in said second position, being inserted into said first aperture so as to seal said first aperture and simultaneously position a substrate supported on said member in said first compartment for processing therewithin;
a substrate transport chamber communicating with said second compartment via said second aperture, said transport chamber including a substrate transport arm, said transport arm adapted to communicate with at least a second processing chamber assembly in like manner; and
a gate device controlling said second aperture, whereby during disassembly and maintenance of said first compartment including said base of said first processing chamber, the normal operation of said transport chamber as well as of said second processing chamber assembly may continue.

22. An apparatus for processing semiconductor wafers, comprising:
a first compartment having a process environment selectively maintainable therein and having a base;
a second compartment;
an aperture extending through said base and thereby between said first compartment and said second compartment; and
a moveable wall dedicated to said first compartment and said second compartment and positionable in said second compartment to receive a wafer thereon and further positionable to seal said aperture to isolate said first compartment from said second compartment and to position the wafer in said first compartment for exposure of the wafer to the process environment selectively maintained therein wherein said base of said first compartment forms the cover of said second compartment and is removable with said first compartment from said second compartment.

23. The apparatus of claim 22, wherein said moveable wall includes an insulative member having an extending seal flange thereon; and said seal flange is engageable against said base.

24. The apparatus of claim 23, further including a seal disposed in said base, said seal engageable with said seal flange when said seal flange is engaged against said base.

25. The apparatus of claim 24, wherein said seal flange includes a seal protecting lip extending therefrom; and said base includes a recess therein, and said lip is receivable in said recess.

26. The apparatus of claim 22, further including:

a pump aperture and a poppet valve aperture at least one of which is disposed in said base; and a pump disposed on said pump aperture and a poppet valve disposed on said poppet valve aperture;

whereby said poppet valve is positioned to throttle said pump aperture.

27. The apparatus of claim 22, further including an intermediate wafer support in said second compartment and isolated from the process environment maintainable in said first compartment.

28. The apparatus of claim 22, wherein:

said first compartment includes an exhaust orifice, having a pump aperture therein, extending therefrom;

said second compartment includes a pump support flange; and said pump aperture is removably received within said pump flange.

29. The apparatus of claim 22, wherein said first compartment is symmetrical.

30. A substrate support member positionable in a first compartment for receiving a substrate thereon and further positionable to seal an opening extending between the first compartment and a second compartment while positioning the substrate for exposure to a process environment maintainable in the second compartment, comprising:

an insulative base having a flange portion engageable about the periphery of the opening extending between the first compartment and the second compartment to provide the sealing of the opening at said periphery;

a conductive member received on said insulative base and electrically biasable to form a cathode for maintaining a plasma within a gaseous environment maintainable in the second compartment;

a wall extending from said insulative member and circumscribing said conductive member;

wherein said flange is located radially outwardly of said annular wall;

further including a seal extending between said flange and the underside of the second compartment about the perimeter of the opening wherein said flange further includes a lip extending therefrom and receivable in a recess provided therefor in the wall of the second compartment about the periphery of said opening.

31. The substrate support member of claim 30, wherein said lip is located radially inwardly of the position at which said flange contacts said seal.

32. An apparatus for processing substrates comprising:

a first compartment having a process volume and a vacuum port extending therefrom;

a second compartment having a support portion, said support portion having a pump mounting flange thereon;

a vacuum pump received on said flange; and said vacuum port extending into communication with said vacuum pump to enable use of said vacuum pump as a vacuum source for said first compartment.

33. The apparatus of claim 32, wherein said support portion is cantilevered from a side of said second compartment.

34. The apparatus of claim 32, wherein said vacuum port includes an exhaust orifice communicating with said process volume of said first compartment and a sleeve extending inwardly of said pump flange.

35. The apparatus of claim 34, further including a throttling portion interdisposed between said exhaust orifice and said sleeve.

36. The apparatus of claim 35, wherein said throttled orifice is throttled by the placement of a throttling member over selected portions of the entry of said exhaust orifice into said sleeve portion.

37. The apparatus of claim 36, wherein said throttling member is a poppet valve.

38. The apparatus of claim 37, further including a gate valve disposed on said pump flange between said pump flange and said pump.

39. A substrate processing chamber, comprising:

a first compartment defining a process volume and a vacuum exhaust port to a pump aperture;

a second compartment defining a containment volume;

a common aperture extending between said first compartment and said second compartment;

a support member selectively positionable to receive a substrate thereon and to block said common aperture while positioning a substrate to be exposed to a process environment in said process volume; and a cover disposed over said process volume;

wherein said process volume and said vacuum exhaust port are configured from a single piece of material which can be replaced separate from said second compartment.

40. The substrate processing chamber of claim 39, wherein said common aperture extends through a wall of the first compartment; and said wall is shared with said second compartment.

41. The substrate processing chamber of claim 39, wherein said process volume and exhaust port are configured from a conductive material.

42. The substrate processing chamber of claim 41, wherein said support member includes an insulative portion and a conductive portion; and said insulative portion electrically isolates said conductive portion from contact with said process volume and exhaust port material.

43. The substrate processing chamber of claim 42, wherein said conductive portion includes an electrode configured as a cathode to support a plasma in said process volume.

44. The substrate processing chamber of claim 43, wherein:

said insulative portion includes a flange extending outwardly from said conductive portion; and said flange is contacted with said first compartment when said support member is positioned to position the substrate for exposure to a process environment maintainable in said process volume.

45. The substrate support member of claim 44 further including a seal member received one said first compartment about the periphery of said aperture and contactable with said flange when said support member is positioned to position the substrate for exposure to a process environment maintainable in said process volume.

46. The substrate support member of claim 45, further including a circumferential recess extending about the periphery of said aperture; and a circumferential lip extending from said flange and receivable within said recess.

47. The substrate processing apparatus of claim 46, wherein said circumferential lip is positioned radially inwardly of the position where said seal engages said flange.

* * * * *